METHOD OF MANUFACTURING A TRANSISTOR

Filed Dec. 28, 1966 2 Sheets-Sheet 1

INVENTOR
Reinhold Kaiser

BY Spencer & Kaye
ATTORNEYS

INVENTOR
Reinhold Kaiser
BY Spencer & Kaye
ATTORNEYS

United States Patent Office 3,507,715
Patented Apr. 21, 1970

3,507,715
METHOD OF MANUFACTURING A TRANSISTOR
Reinhold Kaiser, Heilbronn, Germany, assignor to Telefunken Patentverwertungsgesellschaft m.b.H., Ulm (Danube), Germany
Filed Dec. 28, 1966, Ser. No. 605,342
Claims priority, application Germany, Dec. 28, 1965, T 30,152
Int. Cl. H01l 7/44
U.S. Cl. 148—187 8 Claims

ABSTRACT OF THE DISCLOSURE

A method of manufacturing transistors by the planar technique by forming an annular diffusion window on one surface of a semiconductor body, diffusing impurities through the annular diffusion window to form a first impurity zone, covering the diffusion window, uncovering the central part of the diffusion window, and diffusing impurities through the central part of the diffusion window to form a second and a third impurity zone.

BACKGROUND OF THE INVENTION

This invention generally relates to the manufacture of transistors by the planar technique, i.e., by forming in a semiconductor body impurity regions of certain conductivity type by diffusing impurity atoms into the semiconductor body through windows in a diffusion-inhibiting mask applied to the surface of the semiconductor body.

Planar transistors, i.e., transistors manufactured by the planar technique, have been produced in the past by applying an oxide layer to one surface of a semiconductor body to form a diffusion-inhibiting mask, cutting a window into this mask, diffusing impurities through the window into the semiconductor body to establish a base region, applying another oxide layer mask over the first window, cutting a second window into this mask smaller than the first-mentioned window, and diffusing impurities through this smaller window into the semiconductor body to establish an emitter region.

Although the above-noted prior art method produced workable transistors, it had the drawback that the base region of the transistor could not be given a steep impurity gradient because the base region had to be heat treated several times due to the fact that the base region had to be covered with a second oxidizing layer before the emitter region could be diffused into the semiconductor body. This multiple application of heat to the base region spreads the impurities forming the base region and makes it impossible to achieve a steep impurity gradient.

SUMMARY OF THE INVENTION

The object of this invention is to provide a method of manufacturing transistors by the planar technique which eliminates the above-noted drawback. The method of producing a transistor according to this invention includes the steps of covering one surface of a semiconductor body with a first diffusion-inhibiting layer; removing an annular portion of the diffusion-inhibiting layer to form an annular diffusion window; diffusing impurities through the annular window to produce a region having the conductivity type of the base of the transistor; covering the surface of the semiconductor body again with a second diffusion-inhibiting layer; removing the diffusion-inhibiting layers within the central portion of the annular diffusion window to form a second diffusion window; and diffusing impurities through the second window into the semiconductor body to establish the base region and the emitter region of the transistor.

The method of this invention has several advantages.

First, the base region of the transistor can be given a relatively steep impurity gradient because, since the same diffusion window is used for base diffusion and for emitter diffusion, no further diffusion window is necessary for the emitter diffusion and as a result, the heat treatment which hitherto adversely affected the impurity gradient in the base zone is eliminated after the base diffusion. The invention also has the advantage that the effective emitter region can be made narrower than that of the prior art emitter regions. Finally, the invention also makes it possible to produce the base region and the emitter region simultaneously by diffusion.

DESCRIPTION OF THE PREFERRED EMBODIMENTS

Figure 1:
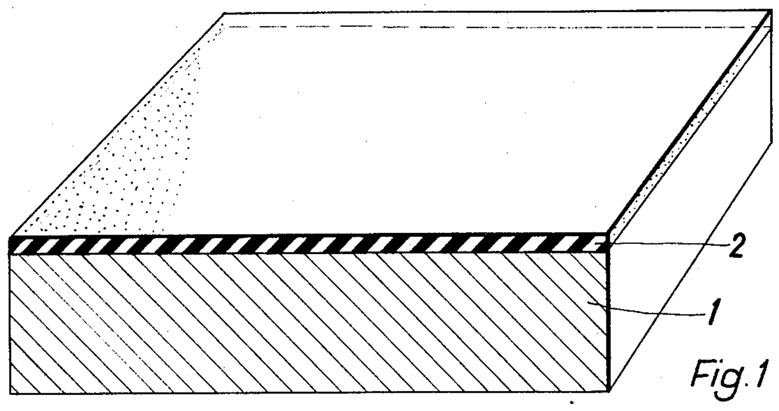
FIGURE 1 is a perspective sectional view of a basic semiconductor body having a diffusion-inhibiting layer on one surface.
Figures 2, 3:
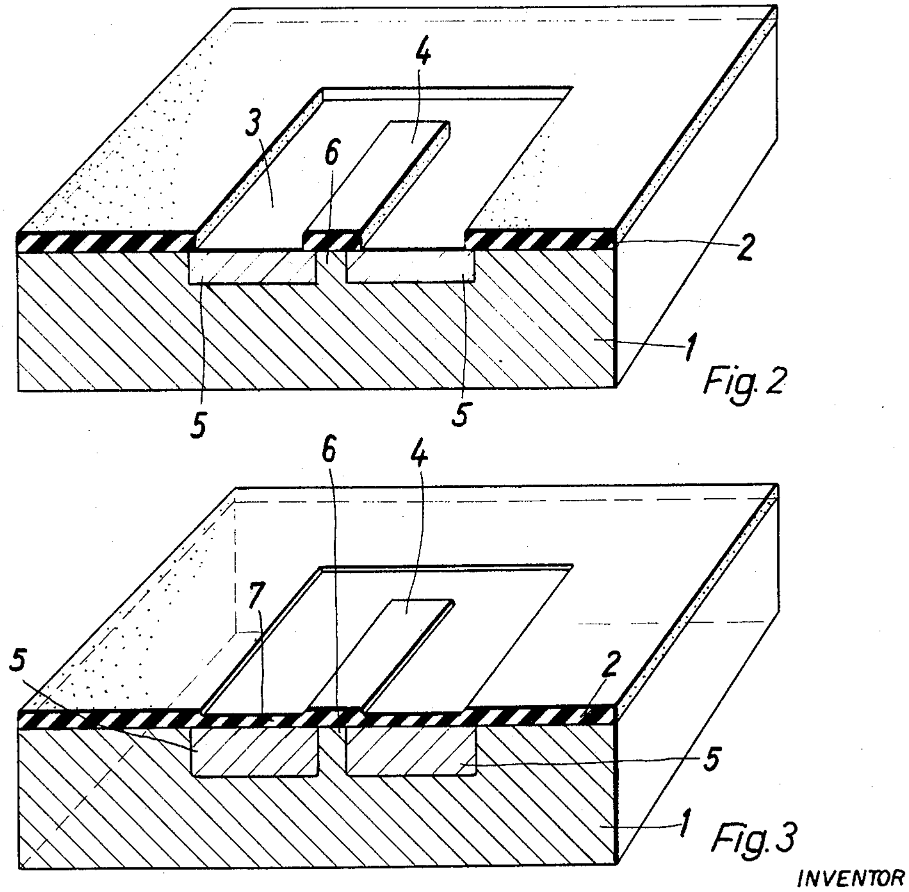
FIGURE 2 is a perspective sectional view of the semiconductor body of FIGURE 1 showing an annular diffusion window with regions of different conductivity type diffused into the basic semiconductor body.
FIGURE 3 is a perspective sectional view of the semiconductor body of FIGURE 2 showing the semiconductor body covered by a second diffusion-inhibiting layer.

As shown in FIGURE 1, in order to produce a planar transistor according to the invention, a semiconductor body 1 of silicon having the conductivity type of the collector zone is oxidized at one of its surfaces to form a silicon dioxide layer 2, which acts as a diffusion-inhibiting layer. As shown in FIGURE 2, an annular diffusion window 3 is etched out of the silicon dioxide layer, the central portion 4 of the oxide layer being left on the semiconductor body in the middle of the diffusion window. The diffusion window is shown as being rectangular in shape, but it will be understood by those skilled in the art that it could be circular if desired. Impurities are then diffused through area 3 to form impurity region 5 having the conductivity type of the base region. Since during this diffusion, the area of the semiconductor surface into which the emitter region will be diffused later is covered by the area 4 of the oxide layer, the impurities only enter the marginal zone of the region situated below the area 4 of the oxide layer when impurities are diffused into region 5. The region 6, on the other hand, remains unaffected by the diffusion impurities.

During or after the production of the semiconductor region 5 by diffusion, the semiconductor surface is covered with a second oxide layer 7 as shown in FIGURE 3. In the course of this, the oxide layer already in existence is thickened and, as a result of the heat treatment necessary for the oxidation, the semiconductor region 5 is diffused deeper into the semiconductor body than is the case in FIGURE 2.

Figure 4:
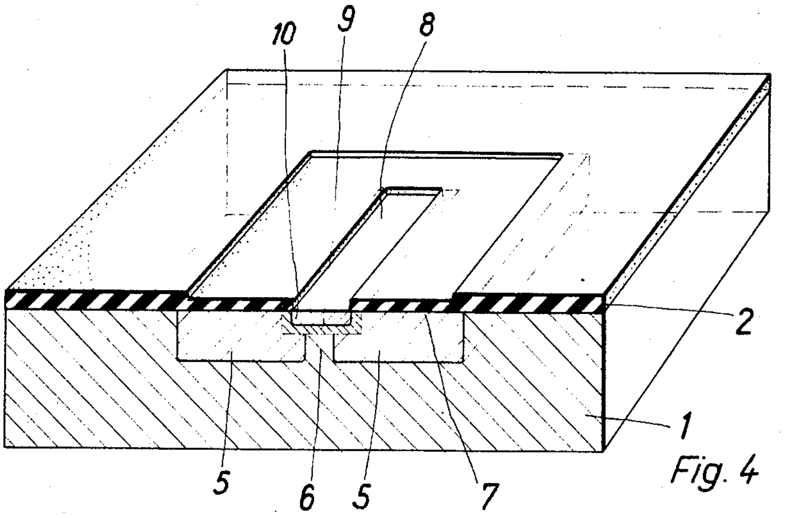
FIGURE 4 is a perspective sectional view of the semiconductor body of FIGURE 3 showing a diffusion window and further regions of different conductivity type diffused into the basic semiconductor body.

Following the second oxidation process, a second diffusion window 8 is etched out of the oxide layer in the area above the semiconductor region 6 which has remained unaffected by the diffusion, as shown in FIGURE 4. Both the base region 9 and the emitter region 10 are established by diffusion in the semiconductor body 1 through window 8 as shown in FIGURE 4. The base region and the emitter region may be produced in one diffusion step. The impurity concentration of the actual base region 9 may be greater, equal to, or less than the impurity concentration of the semiconductor region 5 of the same type of conductivity. A lower impurity concentration in the base region 9 than in the semiconductor zone 5 is desirable, for example, in power transistors.

Figure 5:
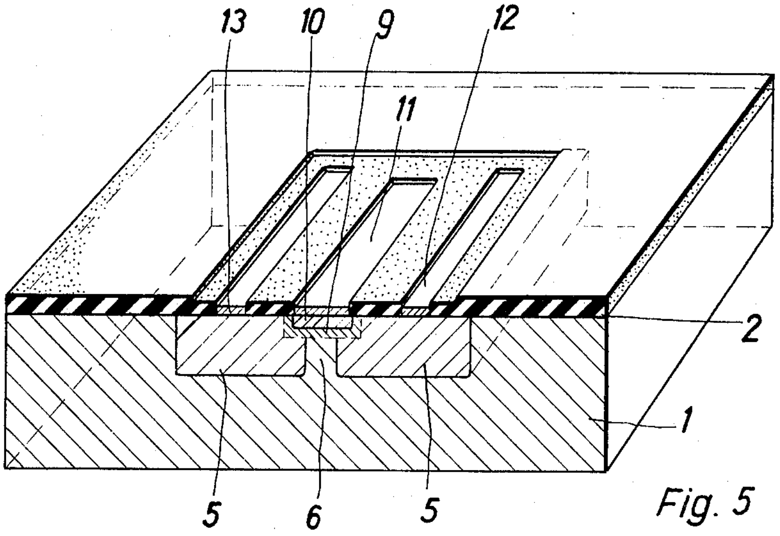
FIGURE 5 is a perspective sectional view of the semiconductor body of FIGURE 4 showing contact means applied to regions of different conductivity types.

Finally, FIGURE 5 shows the method of making contact to the different regions of the planar transistor. The contact to the emitter region 10 is effected by vapor depositing a metal layer 11 on the emitter surface exposed through the diffusion window 8. Contact is made to the actual base region 9 through the semiconductor region 5 of the same type of conductivity by etching out portions of the oxide layer covering the semiconductor region 5 and producing the metal layers 12 and 13 by vapor deposition on the areas of the semiconductor surface thus exposed. The finished transistor thus has three metal strips, two of which make contact with the base region, and one of which makes contact with the emitter region. It will be apparent to those skilled in the art that output leads may be easily attached to metal layers 11, 12 and 13 to make contact with the base and emitter regions of the transistor, and that contact may be made to the collector region of the transistor by making ohmic contact with the un-oxidized surface of semiconductor body 1.

The method of this invention can be practiced with any suitable materials, but as a specific example, the following detailed steps were followed to produce a npn-type of transistor by the method of this invention. First a layer of silicon dioxide 0.4$\mu$ thick was deposited on a semiconductor body of n-type silicon. Next an annular window 0.1 mm. long, 0.07 mm. wide, was formed in the silicon dioxide layer by etching away the layer with hydrofluoric acid. The dimensions of the central area inside the annular window were 0.08 mm. by 0.01 mm. Next a boron impurity was diffused into the annular window to form a p-type impurity region 2$\mu$ deep. Then another layer of silicon dioxide 0.5$\mu$ thick was deposited over the annular window and a second window 0.08 mm. by 0.01 mm. was formed in the center of the annular window by etching away both layers of silicon dioxide with hydrofluoric acid. Next a boron impurity was diffused into the second window to form a p-type impurity region 1$\mu$ deep and a n-type impurity region 0.6$\mu$ deep. Electrical contact to the various impurity regions was made by vacuum depositing a 0.5$\mu$ layer of aluminium on the exposed surfaces of the impurity layers.

It will be understood that the above description of the present invention is susceptible to various modifications, changes, and adaptations, and the same are intended to be comprehended within the meaning and range of equivalents of the appended claims.

I claim:

1. A method of manufacturing a transistor from a semiconductor body having a conductivity type corresponding to the collector region of a desired transistor, comprising the steps of:

(A) forming a first layer of diffusion-inhibiting material on one surface of said semiconductor body;

(B) removing an annular portion of said diffusion-inhibiting layer to form an annular diffusion window;

(C) diffusing impurities through said annular diffusion window for producing in said semiconductor body a first region having a conductivity type corresponding to the base region of said desired transistor;

(D) forming a second layer of diffusion-inhibiting material on the surface of said semiconductor body over said annular diffusion window;

(E) removing said first and second layers of diffusion-inhibiting material from the central area of said annular diffusion window; and (F) diffusing impurities through the central area of said annular diffusion window for producing in said semiconductor body a second region having a conductivity type corresponding to the base region of said desired transistor and a third region having a conductivity type corresponding to the emitter region of said desired transistor.

2. A method as defined in claim 1 wherein said second region and said third region are diffused simultaneously into the semiconductor body.

3. A method as defined in claim 1 wherein said diffusion-inhibiting layers each comprise an oxide layer.

4. A method as defined in claim 3 wherein said semiconductor body is made of silicon and said oxide layers comprise silicon dioxide layers.

5. A method as defined in claim 1 wherein the impurity concentration of said first region is higher than that of said second region.

6. A method as defined in claim 1 wherein the impurity concentration of said first region is equal to that of said second region.

7. A method as defined in claim 1 wherein the impurity concentration of said first region is smaller than that of said second region.

8. A method as defined in claim 1 wherein contact is made to said second region by contacting said first region.

References Cited

UNITED STATES PATENTS

| | | | |
|---|---|---|---|
| 2,804,405 | 8/1957 | Derick | 148—189 |
| 3,295,030 | 12/1966 | Allison | 148—186 |
| 3,312,881 | 4/1967 | Yu | 148—186 |
| 3,341,377 | 9/1967 | Wacker | 148—186 |
| 3,389,023 | 6/1968 | Langdon | 148—190 |
| 3,305,913 | 2/1967 | Loro | 148—186 |

L. DEWAYNE RUTLEDGE, Primary Examiner

R. A. LESTER, Assistant Examiner

U.S. Cl. X.R.

148—188